(12) United States Patent
Li (10) Patent No.: US 11,508,332 B2
(45) Date of Patent: Nov. 22, 2022

(54) OPTICAL SENSOR AND ELECTRONIC DEVICE

(71) Applicant: GUANGDONG OPPO MOBILE TELECOMMUNICATIONS CORP., LTD., Guangdong (CN)

(72) Inventor: Jie Li, Guangdong (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 0 days.

(21) Appl. No.: 16/180,771

(22) Filed: Nov. 5, 2018

(65) Prior Publication Data

US 2019/0279599 A1    Sep. 12, 2019

(30) Foreign Application Priority Data

Mar. 9, 2018 (CN) .......................... 201810194385.8

(51) Int. Cl.
  *G09G 5/10* (2006.01)
  *G01J 1/42* (2006.01)
  (Continued)

(52) U.S. Cl.
  CPC .............. *G09G 5/10* (2013.01); *G01J 1/4204* (2013.01); *G01S 7/4813* (2013.01); *G01S 17/04* (2020.01);
  (Continued)

(58) Field of Classification Search
  CPC .......... G09G 5/10; G09G 3/32; G09G 3/3208; G09G 2320/0626; G09G 2354/00;
  (Continued)

(56) References Cited

U.S. PATENT DOCUMENTS 10,136,076 B2 * 11/2018 Tanaka ................. H04N 5/2352
10,359,310 B2 * 7/2019 Inoue ......................... G01J 1/32
(Continued)

FOREIGN PATENT DOCUMENTS

CN     2098676      3/1992
CN    101655231     2/2010
(Continued)

OTHER PUBLICATIONS

English Translation of CN 206962916 (Year: 2018).*
(Continued)

*Primary Examiner* — Patrick N Edouard
*Assistant Examiner* — Eboni N Giles
(74) *Attorney, Agent, or Firm* — Hodgson Russ LLP (57) ABSTRACT

An optical sensor, an electronic device and a manufacturing method for the same are provided. The electronic device includes a light-permeable display screen and an optical sensor. The light-permeable display screen has a first surface and a second surface facing away from the first surface. The optical sensor is arranged opposite to the second surface of the light-permeable display screen. The optical sensor includes a base plate, an emitter and a receiver. The emitter is coupled to the base plate and faces the second surface of the light-permeable display screen. The receiver surrounds the emitter and is configured to communicate with the emitter.

10 Claims, 10 Drawing Sheets

(51) Int. Cl.
  *G01S 17/08* (2006.01)
  *G06F 3/041* (2006.01)
  *G01S 7/481* (2006.01)
  *H04M 1/02* (2006.01)
  *G01S 17/04* (2020.01)
  *G09G 3/32* (2016.01)
  *G09G 3/3208* (2016.01)

(52) U.S. Cl.
  CPC .............. *G01S 17/08* (2013.01); *G06F 3/041* (2013.01); *H04M 1/026* (2013.01); *G09G 3/32* (2013.01); *G09G 3/3208* (2013.01); *G09G 2320/0626* (2013.01); *G09G 2354/00* (2013.01); *G09G 2360/144* (2013.01); *H04M 1/0266* (2013.01)

(58) Field of Classification Search
  CPC ............. G09G 2360/144; G01J 1/4204; G01S 7/4813; G01S 17/026; G01S 17/08; G06F 3/041; H04M 1/026; H04M 1/0266
  See application file for complete search history.

(56) References Cited

U.S. PATENT DOCUMENTS

| | | | |
|---|---|---|---|
| 2010/0046228 A1* | 2/2010 | Tang | G08C 23/04 362/253 |
| 2010/0164479 A1 | 7/2010 | Alameh et al. | |
| 2010/0294938 A1* | 11/2010 | Alameh | G06F 3/03549 250/342 |
| 2011/0297831 A1 | 12/2011 | Yao et al. | |
| 2013/0251215 A1* | 9/2013 | Coons | H04N 5/2256 382/118 |
| 2016/0091363 A1 | 3/2016 | Shirahashi et al. | |
| 2016/0377762 A1 | 12/2016 | Uedaira | |
| 2019/0080668 A1* | 3/2019 | Holenarsipur | H04N 5/33 |
| 2019/0104625 A1* | 4/2019 | Rogers | G02B 1/14 |

FOREIGN PATENT DOCUMENTS

| | | | |
|---|---|---|---|
| CN | 103630153 | 3/2014 | |
| CN | 104871009 | 8/2015 | |
| CN | 103630153 | 8/2016 | |
| CN | 106850101 | 6/2017 | |
| CN | 107124484 | 9/2017 | |
| CN | 206640637 | 11/2017 | |
| CN | 107615016 | 1/2018 | |
| CN | 206948392 | 1/2018 | |
| CN | 206962916 | 2/2018 | |
| CN | 108534891 | 9/2018 | |
| EP | 3236390 A1 * | 10/2017 | ........... G06K 9/0004 |
| EP | 3361362 | 8/2018 | |

OTHER PUBLICATIONS

English Translation of CN 206948392 (Year: 2018).*
EPO, Office Action for EP Application No. 18207999, dated Feb. 11, 2019.
WIPO, English translation of the ISR and WO for PCT/CN2018/116646, dated Jan. 31, 2019.
SIPO, First Office Action for CN Application No. 201810194385.8, dated Oct. 21, 2019.
EPO, Office Action for EP Application No. 18207999.6, dated Apr. 1, 2020.
IPI, Examination Report for IN Application No. 201814044363, dated Aug. 19, 2020.
SIPO, Second Office Action for CN Application No. 201810194385.8, dated Jun. 30, 2020.
European Patent Office, Office Action for EP Application No. 18207999.6, dated Apr. 1, 2021.
SIPO, Third Office Action for CN Application No. 201810194385.8, dated Jan. 18, 2021.
EPO, Communication for EP Application No. 18207999.6, dated Jun. 1, 2022.

* cited by examiner

Coupling a buffer layer to the second surface of the light-permeable display screen — S305

Providing a metal sheet below the buffer layer — S306

Fig. 18

OPTICAL SENSOR AND ELECTRONIC DEVICE

CROSS REFERENCE TO RELATED APPLICATION

The present application claims priority to Chinese Application No. 201810194385.8, filed with the State Intellectual Property Office of P. R. China on Mar. 9, 2018, the entire disclosure of which is incorporated herein by reference.

FIELD

The present disclosure relates to a technical field of electronic technologies, and particularly to an optical sensor and an electronic device.

BACKGROUND

In an electronic device, a proximity sensor and an ambient-light sensor are generally integrated as a whole. In order to ensure reliability of emitting and receiving signals, a cover plate of the electronic device usually needs to be provided with a hole having a relatively large area. However, operations of proving the hole will reduce a screen-to-body ratio of the electronic device, and also cause a lack of aesthetics.

SUMMARY

Embodiments of a first aspect of the present disclosure provide an optical sensor. The optical sensor includes: a base plate; an emitter coupled to the base plate; and a receiver surrounding the emitter and configured to communicate with the emitter.

Embodiments of a second aspect of the present disclosure provide an electronic device. The electronic device includes: a light-permeable display screen and an optical sensor. The light-permeable display screen has a first surface and a second surface facing away from the first surface. The optical sensor is arranged opposite to the second surface of the light-permeable display screen. The optical sensor includes: a base plate; an emitter coupled to the base plate and facing the second surface of the light-permeable display screen; and a receiver surrounding the emitter and configured to communicate with the emitter.

Embodiments of a third aspect of the present disclosure provide an electronic device. The electronic device includes: a light-permeable display screen and an optical sensor. The light-permeable display screen has a first surface and a second surface facing away from the first surface. The optical sensor is arranged opposite to the second surface of the light-permeable display screen. The optical sensor includes: a base plate; a receiver coupled to the base plate and facing the second surface of the light-permeable display screen; and an emitter surrounding the receiver and configured to communicate with the receiver.

BRIEF DESCRIPTION OF THE DRAWINGS

The above and/or appended aspects and advantages of embodiments of the present disclosure will become apparent and more readily appreciated from the following descriptions made with reference the accompanying drawings.

DETAILED DESCRIPTION

Embodiments of the present disclosure will be described in detail in the following. Examples of the embodiments are illustrated in the drawings. The same or similar elements and the elements having same or similar functions are denoted by like reference numerals throughout the descriptions. The embodiments described herein with reference to drawings are explanatory, and used to generally understand the present disclosure. The embodiments shall not be construed to limit the present disclosure.

An electronic device, such as a mobile phone or a tablet PC, usually is provided with an infrared sensor to detect a distance from the electronic device to a user. Tacking the mobile phone as an example, the infrared sensor is arranged in an upper portion of the mobile phone. When the user has a voice call or makes related operations, the mobile phone is moved towards the user's head, the infrared sensor feeds distance information back to a processor, and the processor performs a corresponding instruction, such as turning off lights of a display screen component. In the related art, in order to arrange the infrared sensor in the electronic device, a housing of the electronic device needs to be provided with a corresponding hole for emitting and receiving an infrared light signal. However, with developments of the electronic device, people have higher and higher requirements on an appearance and an operation experience of the mobile phone. The mobile phone has been developed to have a full-screen display, and there is an ultra-narrow bezel between the display screen component and the housing of the mobile phone having the full-screen display. The ultra-narrow bezel has such a small width that the ultra-narrow bezel may not have sufficient space to be provided with the hole. Even if the ultra-narrow bezel is provided with the hole, a strength of the whole ultra-narrow bezel will be reduced, thus decreasing reliability of the electronic device.

Embodiments of the present disclosure provide an optical sensor. The optical sensor includes: a base plate; an emitter coupled to the base plate; and a receiver surrounding the emitter and configured to communicate with the emitter.

Embodiments of the present disclosure provide an electronic device. The electronic device includes: a light-permeable display screen and an optical sensor. The light-permeable display screen has a first surface and a second surface facing away from the first surface. The optical sensor is arranged opposite to the second surface of the light-permeable display screen. The optical sensor includes: a base plate; an emitter coupled to the base plate and facing the second surface of the light-permeable display screen; and a receiver surrounding the emitter and configured to communicate with the emitter.

Figure 1:
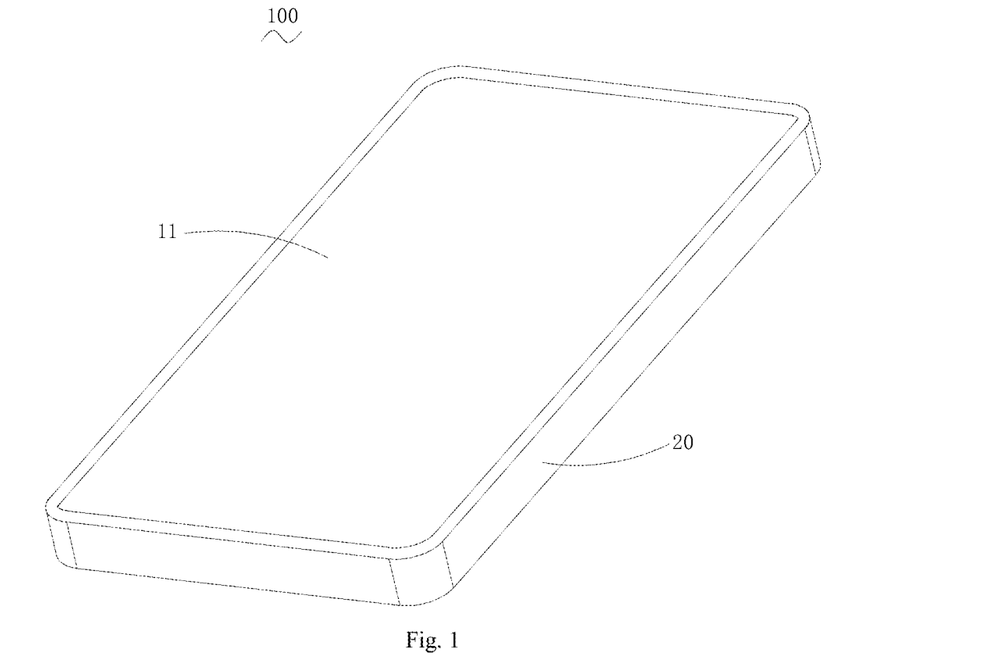
FIG. 1 is a perspective view of an electronic device in the present disclosure.

As illustrated in FIG. 1, an electronic device 100 according to embodiments of the present disclosure may be the mobile phone or the tablet PC. The mobile phone is taken as an example to describe the electronic device 100 according to embodiments of the present disclosure. Certainly, the electronic device 100 may have other specific forms, which will not be defined herein.

Figure 2:
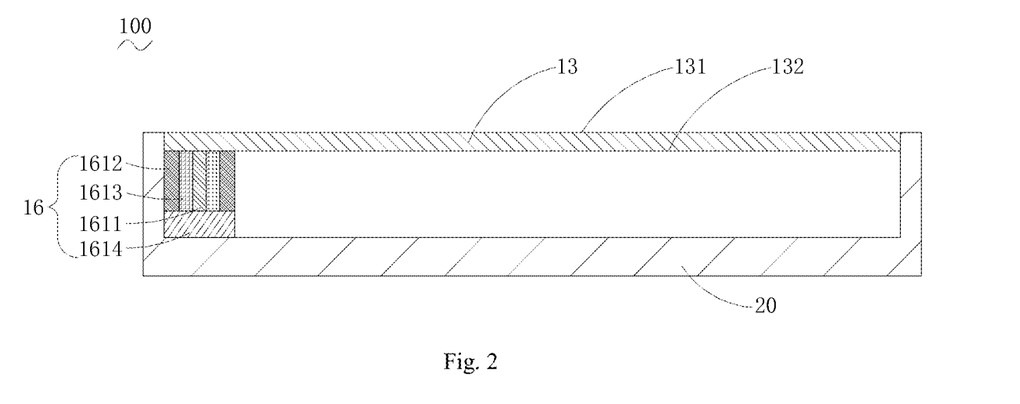
FIG. 2 is a sectional view of the electronic device according to some embodiments of the present disclosure.

As illustrated in FIG. 2, the electronic device 100 includes a light-permeable display screen 13 and an optical sensor 16.

The light-permeable display screen 13 has a first surface 131 and a second surface 132, and the first surface 131 faces away from the second surface 132. The optical sensor 16 is arranged opposite to the second surface 132 of the light-permeable display screen 13. The optical sensor 16 includes a base plate 1614, an emitter 1611 arranged on the base plate 1614 and a receiver 1612 surrounding the emitter 1611. The emitter 1611 faces the second surface 132 of the light-permeable display screen 13 and is configured to emit an infrared light through the light-permeable display screen 13. The receiver 1612 is configured to receive the infrared light.

In some embodiments, the receiver 1612 is further configured to receive a visible light.

When the infrared light emitted by the emitter 1611 encounters an obstacle in a detection direction, a part of the infrared light will be reflected back, passes through the light-permeable display screen 13 and finally is received by the receiver 1612, and thus a distance from the electronic device 100 to the obstacle can be determined by a processor calculating a time of the infrared light from being emitted to being reflected back, such that a corresponding adjustment can be made. For example, when the user makes or receives a call, the electronic device 100 is moved towards the user's head, the emitter 1611 emits the infrared light, and the receiver 1612 receives the infrared light reflected back from the head. After the processor calculates the time of the infrared light from being emitted to being reflected back, a corresponding instruction is generated to control the display screen to turn off its backlight. When the electronic device 100 moves away from the head, the processor calculates again according to the data feed back and generates an instruction to turn on the backlight of the display screen again. In this way, the user's misoperations are prevented, and the battery power of the mobile phone can be saved.

In addition, the receiver 1612 is further configured to detect a light intensity of an environment in which the electronic device 100 is. When the electronic device 100 is in the sun or in a relatively dark environment, the receiver 1612 feeds the light intensity of the surrounding environment back to the processor, and the processor generates the corresponding instruction according to the light intensity, so as to adjust the backlight of the display screen. In actual operations, the receiver 1612 receives the infrared light and the visible light at different time. For example, when a related operation such as receiving a call is performed, a distance detection is conducted; when a related operation such as browsing the displayed content is performed, an ambient brightness detection is conducted. The receiver 1612 has functions of receiving both the infrared light and the visible light, such that a reserved position for disposing a ambient-light receiver is saved, thus improving a space utilization of the electronic device 100.

In some embodiments, the electronic device 100 further includes a housing 20, and the housing 20 is configured to receive elements and components of the electronic device 100 to provide a protection function therefor. By providing the housing 20 to enclose the elements and the components, these elements are protected from direct damages resulted from external factors. The housing 20 may be formed by a computer numerical control (CNC) machine tool processing an aluminium alloy, or may be molded by injection of Polycarbonate (PC) or of PC and acrylonitrile butadiene styrene (ABS) materials.

In conclusion, the optical sensor 16, the electronic device 100 and the manufacturing method for the electronic device 100 according to embodiments of the present disclosure, adopt the light-permeable display screen 13, such that the optical sensor 16 can be arranged below the light-permeable display screen 13 with the full-screen display, and thus the light-permeable display screen 13 and the optical sensor 16 can achieve their own functions without mutual noninterference therebetween. Moreover, the receiver surrounds the emitter to further reduce the occupied portion of the electronic device 100, thus improving the space utilization of the electronic device 100. Since the optical sensor 16 is arranged below the light-permeable display screen 13 with the full-screen display, the conventional operation for providing the hole is avoided, thus ensuring the reliability of the strength of the whole black matrix area of the electronic device 100, and further improving a screen-to-body ratio of the electronic device 100. The emitter 1611 and the receiver 1612 are integrally disposed to provide a compact whole structure of the elements, thus reducing the occupied portion of the electronic device 100 and hence improving the internal space utilization of the electronic device 100.

Figure 4:
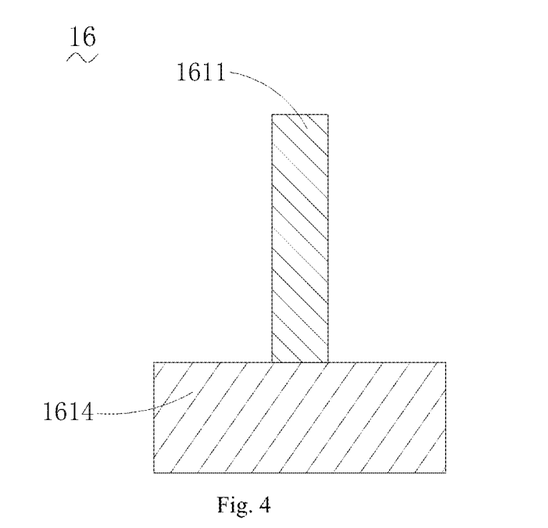
FIG. 4 is a sectional view of an optical sensor according to some embodiments of the present disclosure, in which a receiver is not illustrated.

As illustrated in FIG. 4, in some embodiments, the emitter 1611 has a center coinciding with a center of the base plate 1614.

In some embodiments, the emitter 1611 is arranged at the center of the base plate 1614, thus facilitating the base plate 1614 to bear and fix the emitter 1611 balancedly. The base plate is configured for signal communication between the elements or between the element and the processor. The base plate may be a flexible printed circuit (FPC), which has characteristics of a high wiring density, a light weight, a thin depth and a good bending performance.

Figure 5:
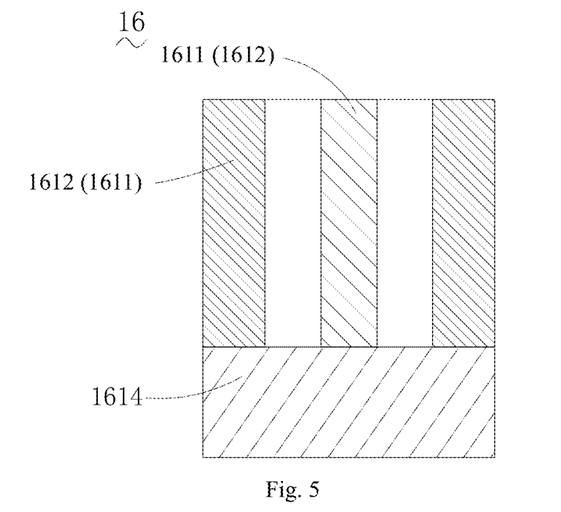
FIG. 5 is a sectional view of an optical sensor according to some embodiments of the present disclosure.

As illustrated in FIG. 5, in some embodiments, the receiver 1612 has a ring shape, and a center of the receiver 1612 coincides with the center of the emitter 1611.

In some embodiments, the receiver 1612 has the ring shape, the receiver 1612 and the emitter 1611 are concentrically disposed, and thus a distance between the emitter 1611 and the receiver 1612 is effectively reduced, thereby facilitating a decrease of the whole size of the optical sensor 16, such that the optical sensor 16 can have more options of possible positions during the assembling of the electronic device 100.

Figure 6A:
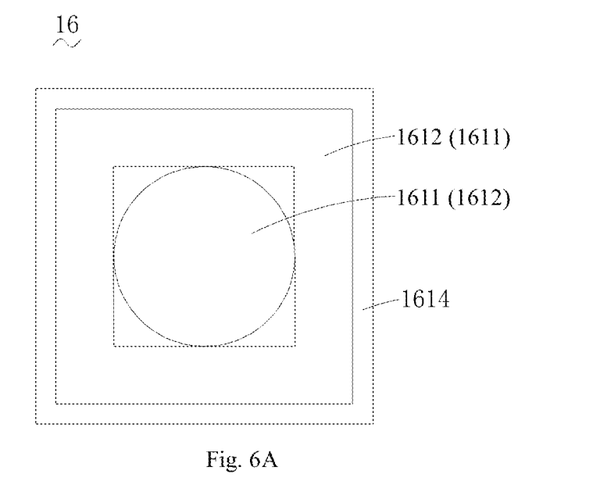
FIG. 6A and FIG. 6B are top views of an optical sensor according to different embodiments of the present disclosure.
Figure 6B:
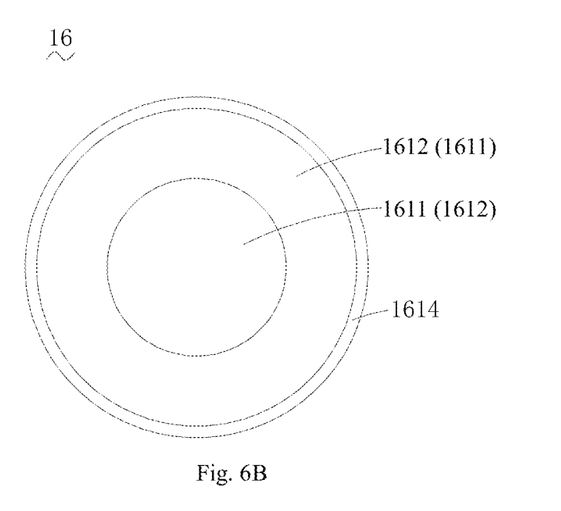

As illustrated in FIG. 6A and FIG. 6B, furthermore, in such embodiments, the ring shape includes a rectangle ring shape or a circular ring shape.

In some embodiments, the shape of the receiver 1612 may be the rectangle ring shape or the circular ring shape. In this way, it is possible for the electronic device 100 to select the optimal shape according to the current position condition, so as to improve the space utilization of the electronic device 100.

Figure 7:
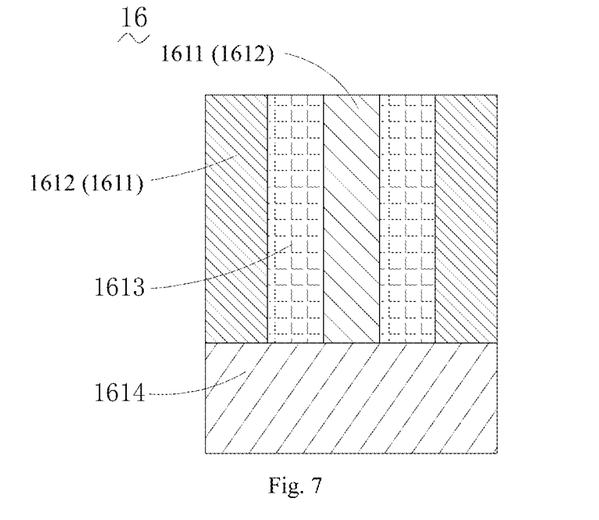
FIG. 7 is a sectional view of an optical sensor in the present disclosure.
Figure 8A:
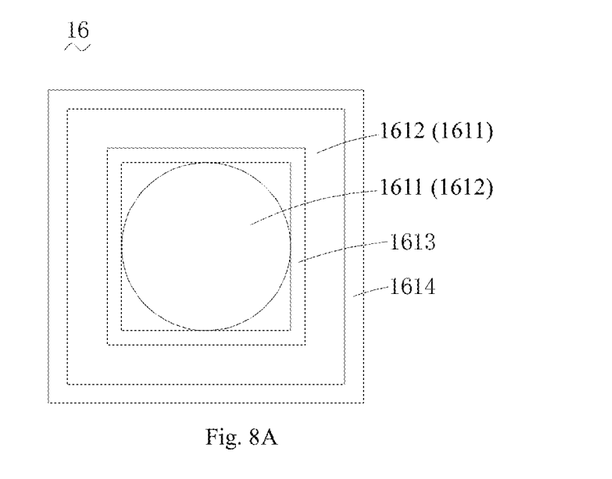
FIG. 8A and FIG. 8B are top views of an optical sensor according to different embodiments of the present disclosure.
Figure 8B:
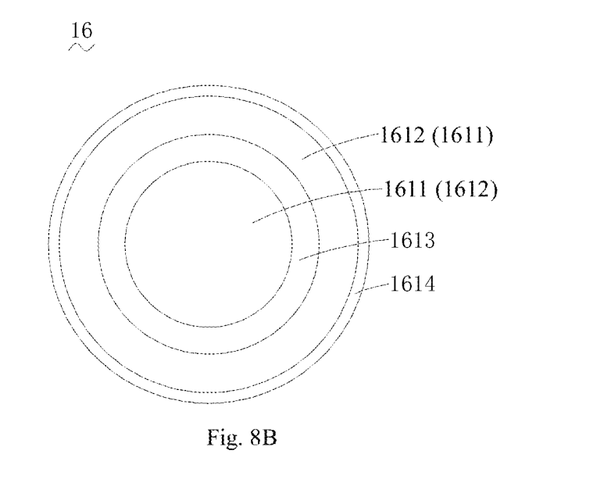

As illustrated in FIG. 7 and FIG. 8A or in FIG. 7 and FIG. 8B, in some embodiments, the optical sensor 16 further includes a separator 1613 arranged between the emitter 1611 and the receiver 1612.

Since the emitter 1611 and the receiver 1612 are disposed concentrically and compactly, during a process of the emitter 1611 sending the infrared light out, a part of the infrared light may have a path deviation and hence be received by the receiver 1612, such that the sense data of the optical sensor 16 has errors and thus is not accurate. By providing the separator 1613 between the emitter 1611 and the receiver 1612, the infrared light having such path deviation can be effectively blocked, thus ensuring normal operations of the emitter 1611 and the receiver 1612. The separator 1613 may be foam made of black materials, and also may be other black foamed plastics or rubber or metal materials. Certainly, these materials are only exemplary, and embodiments of the present disclosure are not limited to this.

In some other embodiments of the present disclosure, also as illustrated in FIGS. 5-8, the emitter 1611 and the receiver 1612 may be exchanged. That is, the receiver 1612 is coupled to the base plate 1614 and faces the second surface 132 of the light-permeable display screen 13, and the emitter 1611 surrounds the receiver 1612.

Further, the receiver 1612 has a center coinciding with a center of the base plate 1614, and the receiver 1612 is arranged at the center of the base plate 1614. Moreover, the emitter 1611 has a ring shape, and a center of the emitter 1611 coincides with the center of the receiver 1612.

In such embodiments, other structures of the optical sensor 16 are same with those of the optical sensor 16 in the above embodiments. For example, the separator 1613 may also be arranged between the emitter 1611 and the receiver 1612 in such embodiments. Therefore, the optical sensors 16 of different embodiments are illustrated in the same FIGS. 5-8, in which only the emitter 1611 and the receiver 1612 are exchanged, but other structures remain unchanged.

As illustrated in FIG. 2, in some embodiments, the light-permeable display screen 13 includes an organic light-emitting diode (OLED) display screen.

In some embodiments, the OLED display screen has great transparency and allows the visible light and the infrared light to pass therethrough. Thus, the OLED display screen allows the optical sensor 16 to emit and receive the infrared light while displaying content. The light-permeable display screen 13 may adopt a Micro light-emitting diode (LED) display screen. The Micro LED display screen also has a great light transmittance for the visible light and the infrared light. Certainly, these display screens are merely exemplary, and embodiments of the present disclosure are not limited to this.

Figure 9:
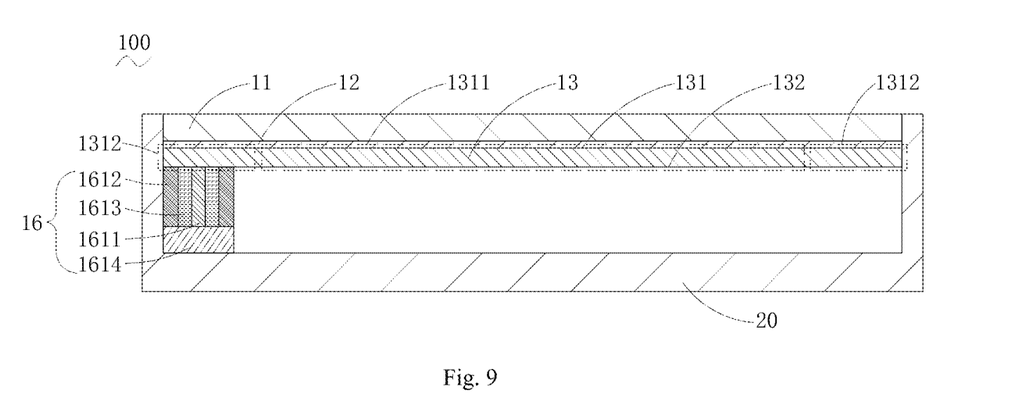
FIG. 9 is a schematic view of an electronic device according to some embodiments of the present disclosure.

As illustrated in FIG. 9, in some embodiments, the electronic device 100 further includes a light-permeable touch panel 12 and a light-permeable cover plate 11. The light-permeable cover plate 11 is arranged on the light-permeable touch panel 12, the light-permeable touch panel 12 is arranged on the light-permeable display screen 13, and the first surface 131 of the light-permeable display screen 13 faces the light-permeable touch panel 12. The light-permeable touch panel 12 and the light-permeable cover plate 13 each have a light transmittance for the visible light larger than 90% and a light transmittance for the infrared light larger than 90%.

In some embodiments, the light-permeable touch panel 12 is mainly configured to receive an input signal generated when the user touches the light-permeable touch panel 12 and to transmit the input signal to the circuit board for data process, so as to obtain a specific position where the user touches the light-permeable touch panel 12. The light-permeable touch panel 12 may be laminated with the light-permeable display screen 13 by using an in-cell lamination technology or an on-cell lamination technology, thus effectively reducing a weight and a whole thickness of the display screen. In addition, since the light-permeable cover plate 11 is arranged on the light-permeable touch panel 12, the light-permeable touch panel 12 and its internal structures can be protected effectively, thus preventing the light-permeable touch panel 12 and the light-permeable display screen 13 from being damaged by an external force. The light-permeable cover plate 11 and the light-permeable touch panel 12 each have a light transmittance for the visible light larger than 90% and a light transmittance for the infrared light larger than 90%, thus facilitating the light-permeable display screen 13 to display the content better, and also facilitating the optical sensor 16 arranged below the light-permeable display screen 13 to emit the infrared light as well as to receive the infrared light and the visible light stably, thereby ensuring normal operations of the optical sensor 16.

Figure 3:
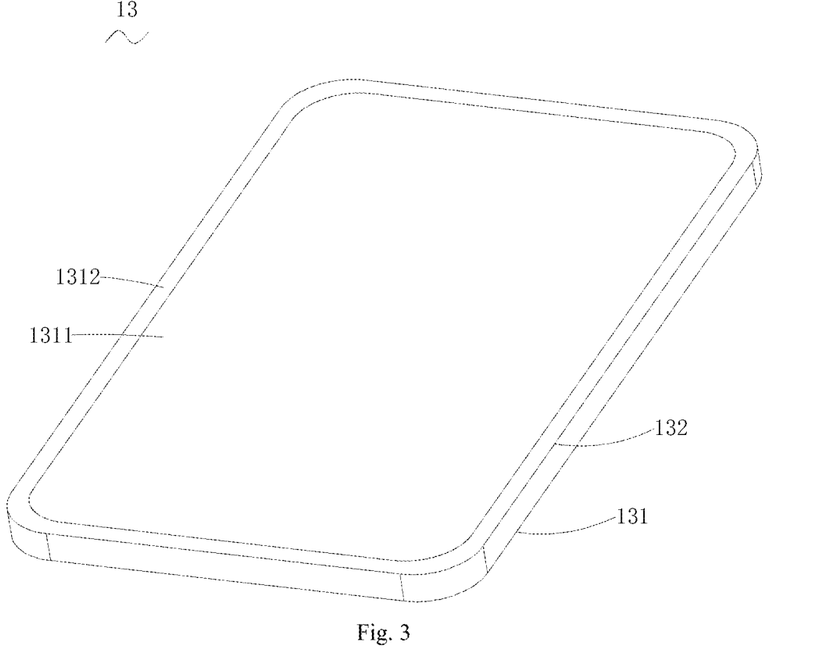
FIG. 3 is a perspective view of a light-permeable display screen in the present disclosure.

As illustrated in FIG. 3, in some embodiments, the second surface 132 of the light-permeable display screen 13 includes a display area 1311 and the light-permeable display screen 13 is configured for light-emitting display through the display area 1311 and the first surface 131. A ratio of an area of the display area 1311 to an area of the light-permeable cover plate 11 is larger than 90%.

By setting the ratio of the area of the display area 1311 to the area of the light-permeable cover plate 11, the display area 1311 can display the content with a relatively large area size after the light-permeable display screen 13 is laminated with the light-permeable cover plate 11, thus improving the user experience, increasing the screen-to-body ratio of the electronic device 100, and hence achieving the full-screen display.

In some embodiments, the second surface 12 of the light-permeable display screen 31 further includes a black matrix area 1312, and the black matrix area 1312 may be configured to shield other elements and metal wires located below the light-permeable display screen 13, thus allowing the appearance of the electronic device 100 to be consistent. The black matrix area 1312 may enhance an optical density of the light-permeable display screen 13 by means of printing ink, so as to provide a great visual effect while ensuring a light shield function.

It can be understood that the first surface 131 of the light-permeable display screen 13 also includes a display area corresponding to that of the second surface 132 of the light-permeable display screen 13 and a black matrix area corresponding to that of the second surface 132 of the light-permeable display screen 13. That is, the whole light-permeable display screen 13 includes a display area and a black matrix area extending from the first surface 131 to the second surface 132.

Figure 10:
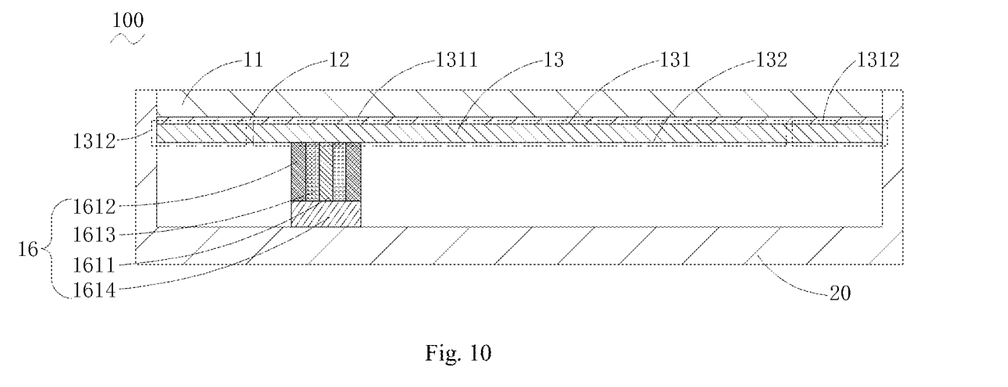
FIG. 10 is a schematic view of an electronic device according to some embodiments of the present disclosure.

As illustrated in FIG. 10, in some embodiments, the optical sensor 16 is arranged opposite to the display area 1311.

Since the optical sensor 16 is opposite to the display area 1311, and the optical sensor 16 needs to emit the infrared light as well as to receive the infrared light and the visible light, the optical sensor 16 cannot be shielded, such that the optical sensor 16 located opposite to the display area 1311 is visible. In order to reduce effects of the optical sensor 16 on the display area 1311, the optical sensor 16 may be arranged at an edge of the display area 1311.

Figure 11A:
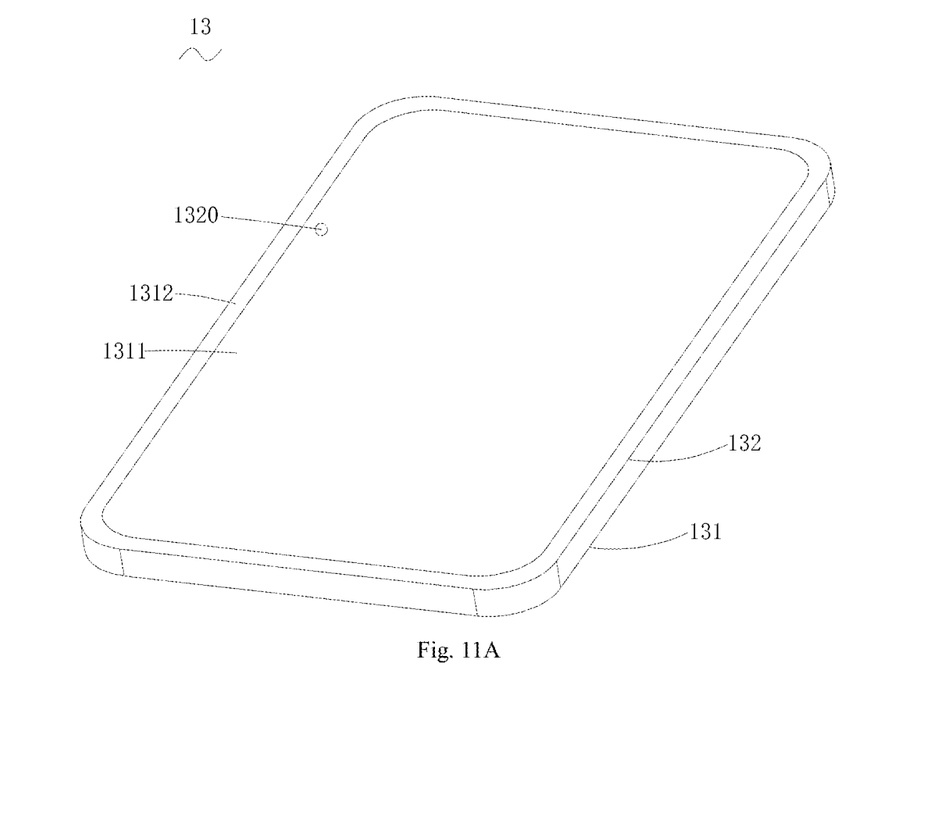
FIG. 11A is a perspective view of a light-permeable display screen according to some embodiments of the present disclosure, in which the light-permeable display screen may be applied to the electronic device illustrated in FIG. 10.

As illustrated in FIG. 11A, furthermore, in such embodiments, the display area 1311 includes a first window region 1320. The optical sensor 16 is configured to emit the infrared light through the first window region 1320 as well as to receive the infrared light and the visible light through the first window region 1320.

In some embodiments, the optical sensor 16 may be arranged in the first window region 1320 of the display area 1311. Since the first window region 1320 needs to be passed through by the infrared light and the visible light, the first window region 1320 is not coated with ink or other coatings.

As illustrated in FIG. 9, in some embodiments, the optical sensor 16 is arranged opposite to the black matrix area 1312.

Since the black matrix area 1312 is not configured to display the content of the light-permeable display screen 13, the optical sensor 16 can be prevented from affecting the content displayed by the light-permeable display screen 13.

Figure 11B:
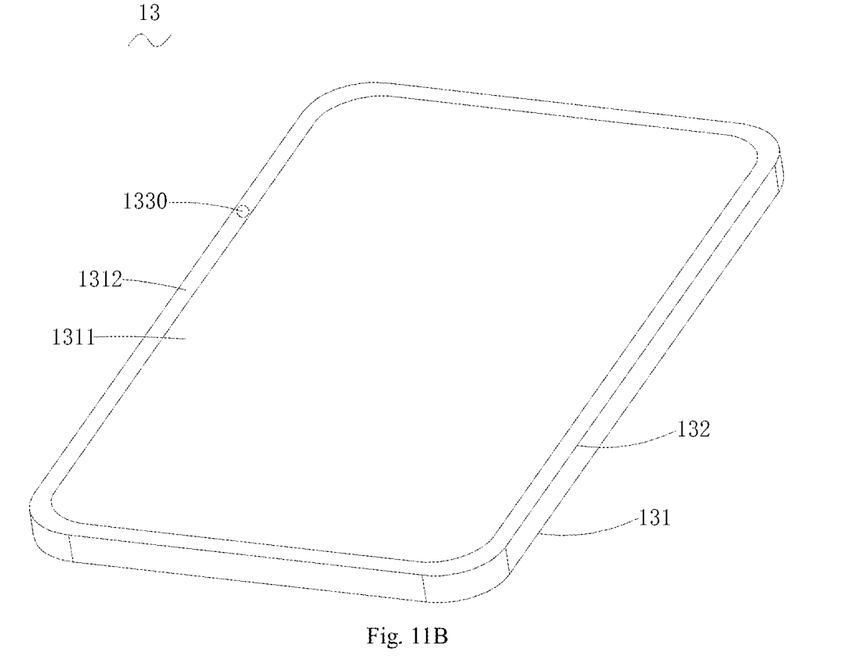
FIG. 11B is a perspective view of a light-permeable display screen according to some embodiments of the present disclosure, in which the light-permeable display screen may be applied to the electronic device illustrated in FIG. 9.

As illustrated in FIG. 11B, furthermore, in such embodiments, the black matrix area 1312 includes a second window region 1330. The optical sensor 16 is configured to emit the infrared light through the second window region 1330 as well as to receive the infrared light and the visible light through the second window region 1330.

In some embodiments, the black matrix area 1312 generally is printed with black ink for light shielding, such that the other elements and metal wires located below the light-permeable display screen 13 are invisible. Since the optical sensor 16 is arranged in the second window region 1330 of the black matrix area 1312, the second window region 1330 is excluded from the process of printing the ink, i.e. the second window region 1330 is not printed with the ink. Moreover, in order to ensure the normal operations of the optical sensor 16, in a direction in which the optical sensor 16 is stacked with the light-permeable display screen 13, an area of an orthographic projection of the second window region 1330 on the black matrix area 1312 is larger than an area of an orthographic projection of the optical sensor 16 on the black matrix area 1312, such that it is ensured that the optical sensor 16 can emit the infrared light as well as receive the infrared light and the visible light normally. Since the second window region 1330 needs to be passed through by the infrared light and the visible light, the second window region 1330 is not coated with ink or other coatings.

In some embodiments, the optical sensor 16 includes a proximity sensor and an ambient-light sensor. The proximity sensor includes a proximity emitter and a proximity receiver, the proximity emitter is configured to emit the infrared light through the second surface 132, and the proximity receiver is configured to receive the infrared light reflected by an object so as to detect a distance from the object to the electronic device 100. The ambient-light sensor includes an ambient-light receiver, and the ambient-light receiver is configured to sense an ambient light so as to adjust a brightness of the light-permeable display screen 13. In such embodiments, the proximity emitter serves as the emitter 1611 of the optical sensor 16, and the ambient-light receiver is integrated with the proximity receiver to serve as the receiver 1612 of the optical sensor 16.

In some embodiments, when the user makes or receives a call, the electronic device 100 is moved towards the user's head, the proximity emitter emits the infrared light, and the proximity receiver receives the reflected infrared light. The processor calculates the time of the infrared light from being emitted to being reflected back, and generates a corresponding instruction to control the display screen to turn off its backlight. When the electronic device 100 moves away from the head, the processor calculates again according to the data feed back and generates an instruction to turn on the backlight of the display screen again. In this way, the user's misoperations are prevented, and the battery power of the mobile phone can be saved.

In addition, the ambient-light receiver is configured to detect a light intensity of an environment in which the electronic device 100 is. When the electronic device 100 is in the sun or in a relatively dark environment, the ambient-light receiver feeds the light intensity of the surrounding environment back to the processor, and the processor generates the corresponding instruction according to the light intensity so as to adjust the backlight of the display screen.

In some embodiments, the proximity receiver and the ambient-light receiver are multiplexed. The proximity receiver and the ambient-light receiver are integrated as a whole, so as to effectively reduce a whole size of the elements, to improve the space utilization of the electronic device 100, and also to provide possible positions for other elements, such that the electronic device 100 can allocate spatial positions of various elements fully. In actual operations, the proximity receiver receives the infrared light and the visible light at different time. For example, when a related operation such as receiving a call is performed, a distance detection is conducted; when a related operation such as browsing the displayed content is performed, an ambient brightness detection is conducted.

Figure 12A:
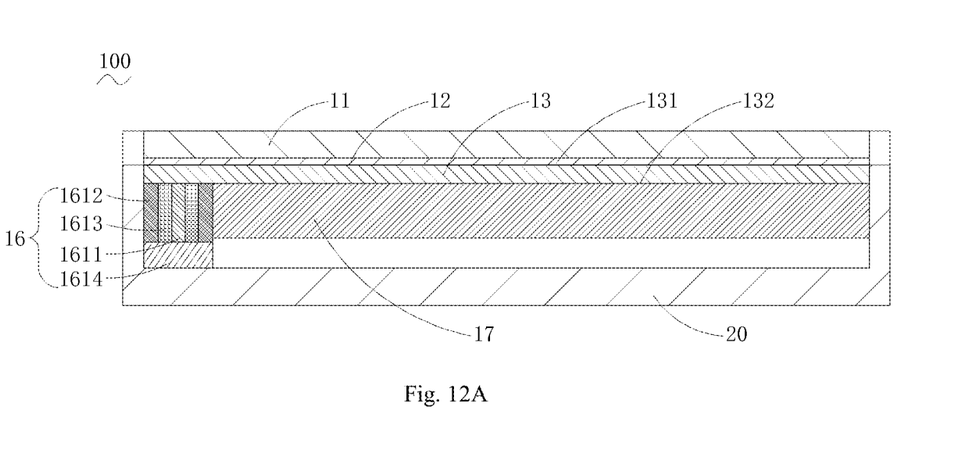
FIG. 12A and FIG. 12B are sectional views of an electronic device according to some embodiments of the present disclosure, in which a buffer layer is illustrated.
Figure 12B:
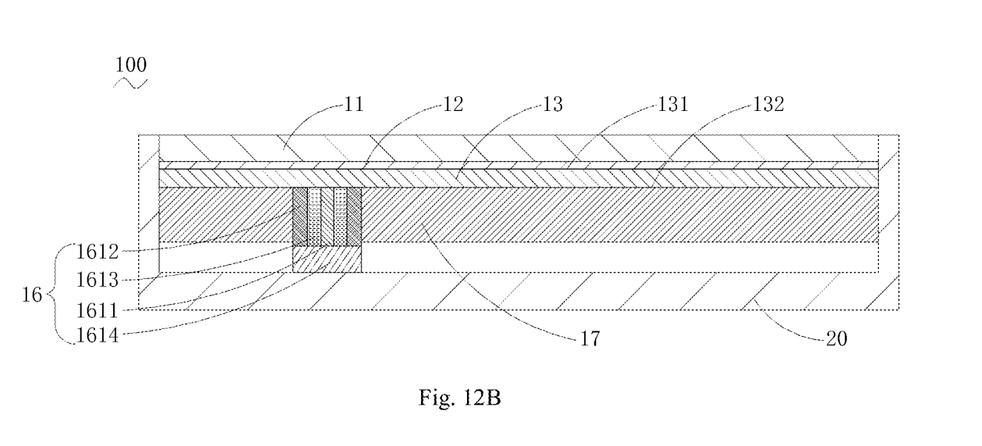

As illustrated in FIG. 12A or FIG. 12B, in some embodiments, a buffer layer 17 is provided at the second surface 132.

In some embodiments, the buffer layer 17 is configured to buffer an impact force and hence to be quakeproof, so as to protect the light-permeable touch panel 12 and the light-permeable display screen 13 as well as their internal structures, thus preventing the display screen from being damaged by an external impact effect. The buffer layer 17 may be made of foam, foamed plastics, rubber or other soft materials. Certainly, these buffer materials are merely exemplary, and embodiments of the present disclosure are not limited to this. In addition, when the optical sensor 16 is arranged opposite to the display area, in order to prevent the buffer layer 17 from affecting the optical sensor 16, the optical sensor 16 is avoided in a process of providing the buffer layer 17, such that the optical sensor 16 will not be affected in emitting the infrared light as well as receiving the infrared light and the visible light.

Figure 13A:
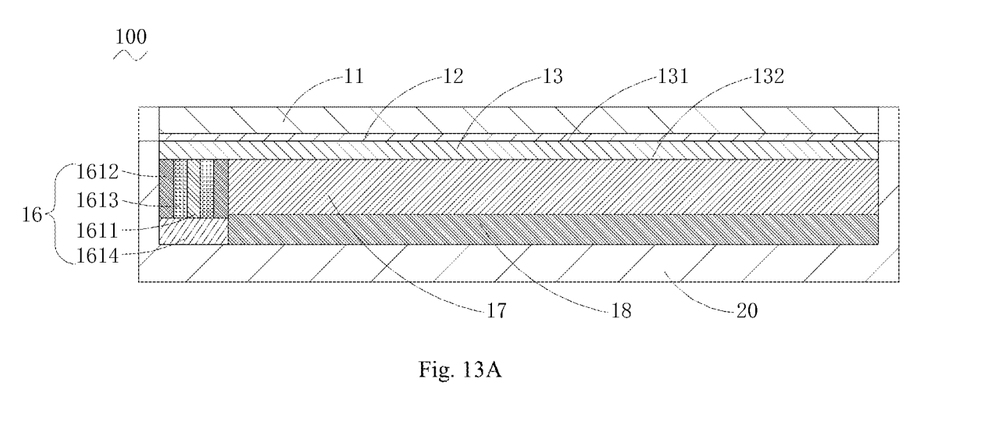
FIG. 13A and FIG. 13B are sectional views of an electronic device according to some embodiments of the present disclosure, in which a metal sheet is illustrated.
Figure 13B:
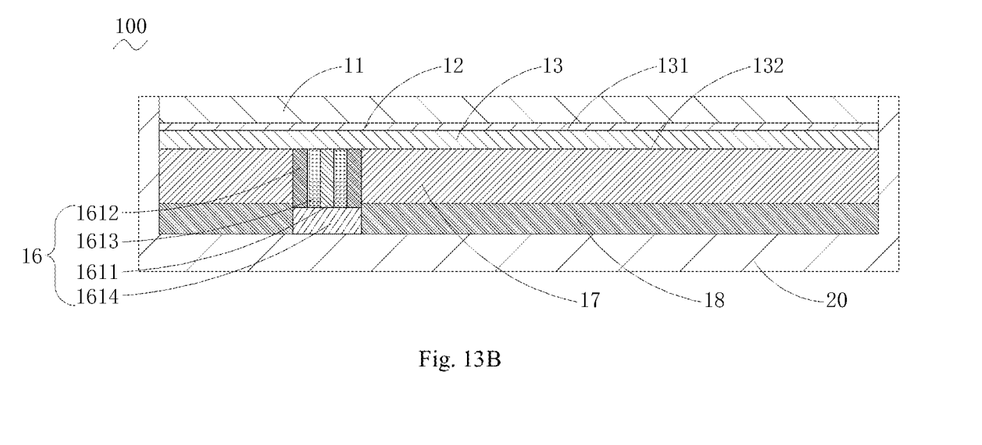

As illustrated in FIG. 13A or FIG. 13B, furthermore, in these amendments, a metal sheet 18 is provided below the buffer layer 17.

In some embodiments, the metal sheet 18 is configured for shielding electromagnetic interferences and also for grounding, and further has a function of diffusing a temperature rise. The metal sheet 18 may be formed by cutting metal materials such as a copper foil and an aluminum foil. Certainly, these metal materials are merely exemplary, and embodiments of the present disclosure are not limited to this. In addition, when the optical sensor 16 is arranged opposite to the display area, in order to prevent the metal sheet 18 from affecting the optical sensor 16, the optical sensor 16 is avoided in a process of providing the metal sheet 18, such that the optical sensor 16 will not be affected in emitting the infrared light as well as receiving the infrared light and the visible light.

Figure 14:
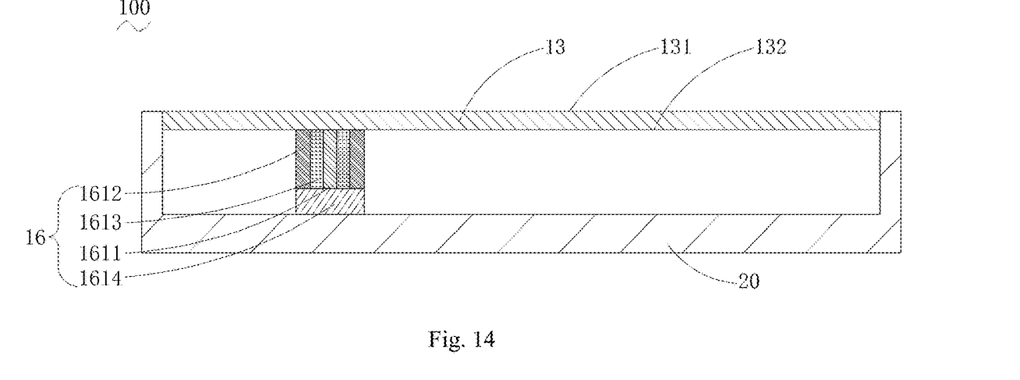
FIG. 14 is a sectional view of an electronic device according to some embodiments of the present disclosure.
Figure 15:
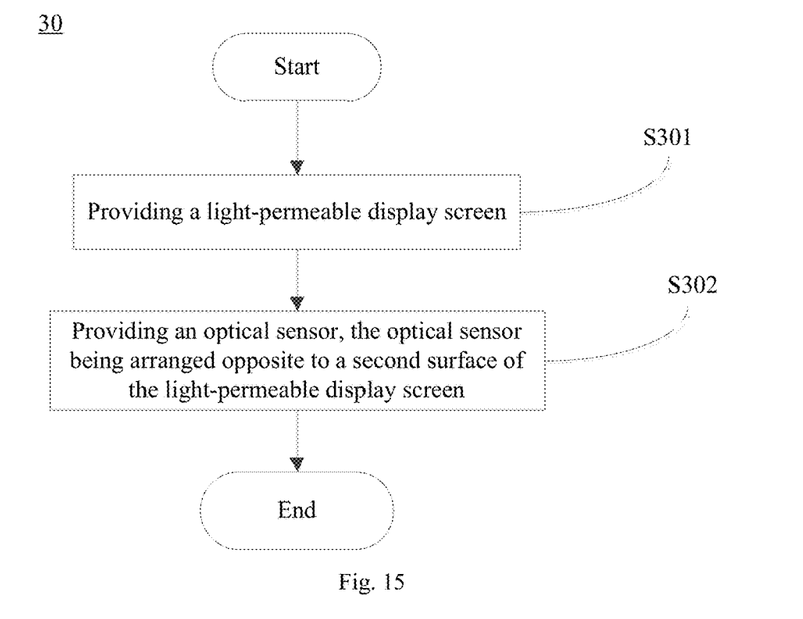
FIG. 15 is a block diagram of a manufacturing method for an electronic device in the present disclosure.

As illustrated in FIG. 2 and FIG. 15 or in FIG. 14 and FIG. 15, embodiments of the present disclosure provide a manufacturing method 30 for an electronic device 100, which includes actions in following blocks.

In block S301, a light-permeable display screen 13 is provided. The light-permeable display screen 13 includes a first surface 131 and a second surface 132, and the first surface 131 faces away from the second surface 132.

In block S302, an optical sensor 16 is provided, and the light-permeable display screen 13 is covered on the optical sensor 16. The optical sensor 16 is arranged opposite to the second surface 132 of the light-permeable display screen 13. The optical sensor 16 includes a base plate 1614, an emitter 1611 arranged on the base plate 1614 and a receiver 1612 surrounding the emitter 1611. The emitter 1611 faces the second surface 132 of the light-permeable display screen 13. The emitter 1611 is configured to emit an infrared light through the light-permeable display screen 13, and the receiver 1612 is configured to receive the infrared light.

In some embodiments, the receiver 1612 is further configured to receive a visible light.

The electronic device 100 adopts the light-permeable display screen 13, such that the optical sensor 16 can be arranged below the light-permeable display screen 13 with the full-screen display, and thus the light-permeable display screen 13 and the optical sensor 16 can achieve their own functions without mutual noninterference therebetween. Moreover, the receiver surrounds the emitter to further reduce the occupied portion of the electronic device 100, thus improving the space utilization of the electronic device 100. The light-permeable display screen 13 may be an organic light-emitting diode (OLED) display screen. The OLED display screen has great transparency and allows the visible light and the infrared light to pass therethrough. Thus, the OLED display screen allows the optical sensor 16 to emit and receive the infrared light while displaying content. The light-permeable display screen 13 may adopt a Micro light-emitting diode (LED) display screen. The Micro LED display screen also has a great light transmittance for the visible light and the infrared light. Certainly, these display screens are merely exemplary, and embodiments of the present disclosure are not limited to this.

Figure 16:
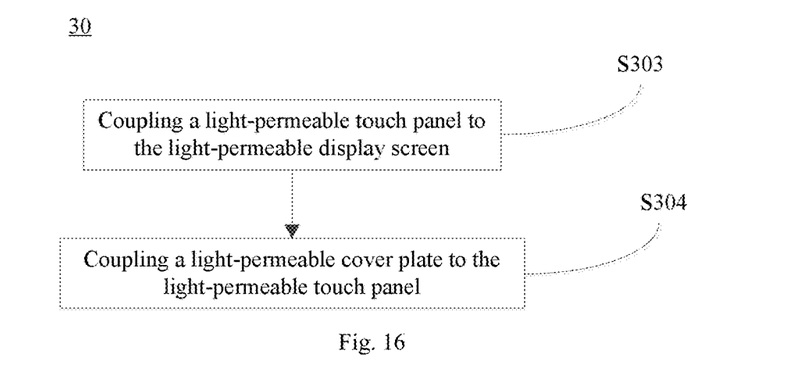
FIG. 16 is a block diagram of the manufacturing method for the electronic device according to some embodiments of the present disclosure, in which a further action is illustrated.

As illustrated in FIG. 9 and FIG. 16 or in FIG. 10 and FIG. 16, in some embodiments, the manufacturing method 30 for the electronic device 100 further includes actions in following blocks.

In block S303, a light-permeable touch panel 12 is coupled to the light-permeable display screen 13.

In some embodiments, the light-permeable touch panel 12 is arranged on the first surface 131 of the light-permeable display screen 13.

In block S304, a light-permeable cover plate 11 is coupled to the light-permeable touch panel 12.

In some embodiments, the light-permeable cover plate 11 is arranged on a side of the light-permeable touch panel 12 facing away from the light-permeable display screen 13.

In some embodiments, the light-permeable touch panel 12 is mainly configured to receive an input signal generated when the user touches the light-permeable touch panel 12 and to transmit the input signal to the circuit board for data process, so as to obtain a specific position where the user touches the light-permeable touch panel 12. The light-permeable touch panel 12 is laminated with the light-permeable display screen 13 by using an in-cell lamination technology or an on-cell lamination technology, thus effectively reducing a weight and a whole thickness of the display screen. In addition, since the light-permeable cover plate 11 is arranged on the light-permeable touch panel 12, the light-permeable touch panel 12 and its internal structures can be protected, thus preventing the light-permeable touch panel 12 and the light-permeable display screen 13 from being damaged by an external force.

Figure 17:
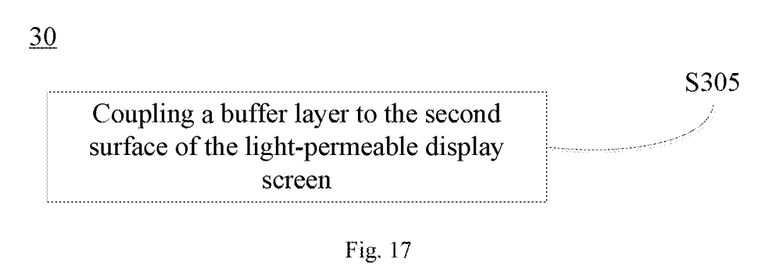
FIG. 17 is a block diagram of the manufacturing method for the electronic device according to some embodiments of the present disclosure, in which a further action is illustrated.

As illustrated in FIG. 12A and FIG. 17 or in FIG. 12B and FIG. 17, in some embodiments, the manufacturing method 30 for the electronic device 100 further includes an action in a following block.

In block S305, a buffer layer 17 is coupled to the second surface 132 of the light-permeable display screen 13, and the buffer layer 17 covers the second surface 132 of the light-permeable display screen 13.

In some embodiments, the buffer layer 17 is configured to buffer an impact force and to be quakeproof, so as to protect the light-permeable touch panel and the light-permeable display screen as well as their internal structures, thus preventing the display screen from being damaged by an external impact effect. The buffer layer 17 may be made of foam, foamed plastics, rubber or other soft materials. Certainly, these buffer materials are merely exemplary, and embodiments of the present disclosure are not limited to this. In addition, when the optical sensor 16 is arranged opposite to the display area, in order to prevent the buffer layer 17 from affecting the optical sensor 16, the optical sensor 16 is avoided in a process of providing the buffer layer 17, such that the optical sensor 16 will not be affected in emitting the infrared light as well as receiving the infrared light and the visible light.

Figure 18:
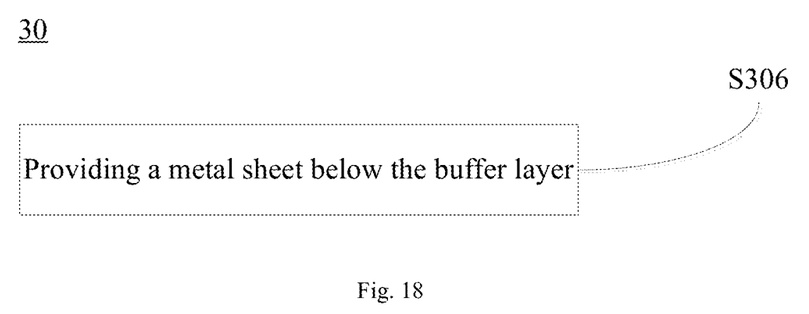
FIG. 18 is a block diagram of the manufacturing method for the electronic device according to some embodiments of the present disclosure, in which a further action is illustrated.

As illustrated in FIG. 13A and FIG. 18 or in FIG. 13B and FIG. 18, furthermore, in these amendments, the manufacturing method 30 for the electronic device 100 further includes an action in a following block.

In block S306, a metal sheet 18 is arranged below the buffer layer 17, and the metal sheet 18 covers the buffer layer 17.

In some embodiments, the metal sheet 18 is configured for shielding electromagnetic interferences and also for grounding, and further has a function of diffusing a temperature rise. The metal sheet 18 may be formed by cutting metal materials such as a copper foil and an aluminum foil. Certainly, these metal materials are merely exemplary, and embodiments of the present disclosure are not limited to this. In addition, when the optical sensor 16 is arranged opposite to the display area, in order to prevent the metal sheet 18 from affecting the optical sensor 16, the optical sensor 16 is avoided in a process of providing the metal sheet 18, such that the optical sensor 16 is not affected in emitting the infrared light as well as receiving the infrared light and the visible light.

In the description of the present disclosure, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature, unless otherwise specified. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature has a sea level elevation larger than the sea level elevation of the second feature. While first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature has a sea level elevation smaller than the sea level elevation of the second feature.

The following disclosure provides many different embodiments or examples to realize different structures of the present disclosure. To simplify the disclosure of the present disclosure, components and configurations in particular examples are elaborated. Of course, they are illustrative, and are not intended to limit the present disclosure. Moreover, reference numbers and/or letters may be repeated in different examples of the present disclosure for the purpose of simplicity and clarity, which shall not be constructed to indicate the relationships among various embodiments and/or configurations. In addition, the present disclosure provides examples of various specific processes and materials, but applicability of other processes and/or utilization of other materials are conceivable for those skilled in the art.

In the specification, it is to be understood that terms such as "central," "thickness," "upper," "lower," "front," "rear," "top," "bottom," should be construed to refer to the orientation as then described or as shown in the drawings under discussion. These relative terms are for convenience of description and do not require that the present disclosure be constructed or operated in a particular orientation. In addition, terms such as "first" and "second" are used herein for purposes of description and are not intended to indicate or imply relative importance or significance and are not intended to implicitly indicate the number of the technical feature mentioned. Thus, features limited by "first" and "second" are intended to indicate or imply including one or more than one these features. In the description of the present disclosure, "a plurality of" means two or more than two, unless specified otherwise.

In the present disclosure, unless specified or limited otherwise, the terms "mounted," "connected," "coupled" and the like are used broadly, and may be, for example, fixed connections, detachable connections, or integral connections; may also be mechanical or electrical connections; may also be direct connections or indirect connections via intervening structures; may also be inner communications of two elements or interaction relationships between two elements. The above terms can be understood by those skilled in the art according to specific situations.

Reference throughout this specification to "an embodiment," "some embodiments," "one embodiment," "another example," "an example," "a specific examples" or "some examples" means that a particular feature, structure, material, or characteristic described in connection with the embodiment or example is included in at least one embodiment or example of the present disclosure. Thus, the appearances of such phrases in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An electronic device, comprising:
a light-permeable display screen having a first surface and a second surface facing away from the first surface; and
an optical sensor being arranged opposite to the second surface of the light-permeable display screen,
wherein the optical sensor comprises:
a base plate;
an emitter coupled to the base plate and facing the second surface of the light-permeable display screen; and
a single receiver surrounding the emitter,
wherein the single receiver has a continuous ring shape, and
wherein the emitter is configured to emit an infrared light to an external object, and the single receiver is configured to receive the infrared light reflected by the external object so as to detect a distance from the external object to the electronic device, and further configured to receive a visible light for detecting an ambient brightness so as to adjust a brightness of the light-permeable display screen according to the ambient brightness,
wherein the single receiver is configured to receive the infrared light and the visible light at different times based upon user operation of the electronic device,
wherein the second surface comprises a display area and a black matrix area surrounding and enclosing the display area, and the light-permeable display screen is configured for light-emitting display through the first surface and the display area,
wherein the optical sensor is arranged opposite to the display area, the display area comprises a window region, and the optical sensor is configured to emit the infrared light through the window region and to receive the infrared light through the window region,
wherein the optical sensor is further configured to receive the visible light through the window region,
wherein the electronic device further comprises:
a buffer layer arranged at the second surface, and configured to buffer an impact force so as to protect the light-permeable display screen; and a metal sheet arranged below the buffer layer, and configured to shield electromagnetic interferences and to diffuse a temperature rise, wherein the optical sensor extends through the buffer layer and the metal sheet to face the second surface of the light-permeable display screen.

2. The electronic device according to claim 1, wherein the emitter has a center coinciding with a center of the base plate.

3. The electronic device according to claim 1, wherein the continuous ring shape comprises a rectangle ring shape or a circular ring shape.

4. The optical sensor electronic device according to claim 1, further comprising a separator arranged between the emitter and the single receiver.

5. The electronic device according to claim 1, wherein the optical sensor comprises a proximity sensor and an ambient-light sensor, the proximity sensor comprises a proximity emitter and a proximity receiver, the proximity emitter is configured to emit an infrared light through the light-permeable display screen, and the proximity receiver is configured to receive the infrared light reflected by an object so as to detect a distance from the object to the electronic device, the ambient-light sensor comprises an ambient-light receiver, and the ambient-light receiver is configured to receive an ambient light so as to adjust a brightness of the light-permeable display screen according to the ambient light, the proximity emitter serves as the emitter of the optical sensor, and the ambient-light receiver is integrated with the proximity receiver to serve as the single receiver of the optical sensor.

6. The electronic device according to claim 1, further comprising:

a light-permeable touch panel coupled to the light-permeable display screen, the first surface of the light-permeable display screen facing the light-permeable touch panel; and a light-permeable cover plate coupled to the light-permeable touch panel and covering the light-permeable touch panel, wherein the light-permeable touch panel and the light-permeable cover plate each having a light transmittance for the visible light larger than 90% and a light transmittance for the infrared light larger than 90%.

7. The electronic device according to claim 6, wherein the light-permeable display screen comprises a display area, and a ratio of an area of the display area to an area of the light-permeable cover plate is larger than 90%.

8. An electronic device, comprising:

a light-permeable display screen having a first surface and a second surface facing away from the first surface; and an optical sensor being arranged opposite to the second surface of the light-permeable display screen, wherein the optical sensor comprises:
a base plate;
an emitter coupled to the base plate and facing the second surface of the light-permeable display screen; and
a single receiver surrounding the emitter, wherein the single receiver has a continuous ring shape, and wherein the emitter is configured to emit and infrared light to an external object, and the single receiver is configured to receive the infrared light reflected by the external object so as to detect a distance from the external object to the electronic device, and further configured to receive a visible light for detecting an ambient brightness so as to adjust a brightness of the light-permeable display screen according to the ambient brightness, wherein the single receiver is configured to receive the infrared light and the visible light at different times based upon user operation of the electronic device, wherein the second surface comprises a display area and a black matrix area surrounding and enclosing the display area, and the optical sensor is arranged opposite to the black matrix area, wherein the black matrix area comprises a window region, and the optical sensor is configured to emit the infrared light through the window region and to receive the infrared light through the window region, wherein the optical sensor is further configured to receive the visible light through the window region, wherein the electronic device further comprises:
a buffer layer arranged at the second surface, and configured to buffer an impact force so as to protect the light-permeable display screen; and
a metal sheet arranged below the buffer layer, and configured to shield electromagnetic interferences and to diffuse a temperature rise, wherein the optical sensor extends through the buffer layer and the metal sheet to face the second surface of the light-permeable display screen.

9. The electronic device according to claim 1, wherein the single receiver is coaxial with the emitter.

10. The electronic device according to claim 1, wherein the single receiver is coupled to the base plate and the base plate is configured for signal communication between the receiver and a processor.

* * * * *